United States Patent [19]

Knaack et al.

[11] Patent Number: 5,642,318

[45] Date of Patent: Jun. 24, 1997

[54] TESTING METHOD FOR FIFOS

[75] Inventors: Roland T. Knaack; Andrew L. Hawkins, both of Starkville, Miss.; Richard A. Rodell, Jr., San Jose, Calif.

[73] Assignee: Cypress Semicondcutor Corporation, San Jose, Calif.

[21] Appl. No.: 567,544

[22] Filed: Dec. 5, 1995

[51] Int. Cl.$^6$ .............................. G11C 7/00; G11C 29/00
[52] U.S. Cl. .......................... 365/201; 365/195; 365/196; 365/221
[58] Field of Search .................... 365/201, 195, 365/196, 189.01, 221; 371/21.2, 21.1

[56] References Cited

U.S. PATENT DOCUMENTS

| | | | |
|---|---|---|---|
| 4,802,122 | 1/1989 | Auvinen et al. | 365/154 |
| 4,891,788 | 1/1990 | Kreifels | 365/49 |
| 5,088,061 | 2/1992 | Golnabi et al. | 365/189.01 |
| 5,228,002 | 7/1993 | Huang | 365/221 |
| 5,262,996 | 11/1993 | Shiue | 362/221 |
| 5,311,475 | 5/1994 | Huang | 365/221 |
| 5,367,486 | 11/1994 | Mori et al. | 365/189.05 |
| 5,404,332 | 4/1995 | Sato et al. | 365/201 |
| 5,406,554 | 4/1995 | Parry | 370/58.1 |
| 5,426,612 | 6/1995 | Ichige et al. | 365/220 |
| 5,467,319 | 11/1995 | Nusinov et al. | 365/231 |
| 5,490,257 | 2/1996 | Hoberman et al. | 365/221 X |
| 5,506,809 | 4/1996 | Csoppenszky et al. | 365/221 |
| 5,546,347 | 8/1996 | Ko et al. | 365/189.02 X |

FOREIGN PATENT DOCUMENTS

| | | |
|---|---|---|
| 1113996 | 1/1989 | Japan . |
| 0676559 | 3/1994 | Japan . |

*Primary Examiner*—Do Hyun Yoo
*Attorney, Agent, or Firm*—Barnes, Kisselle, Raisch, Choate, Wittemore & Hulbert, P.C.

[57] ABSTRACT

The present invention provides a system for testing a memory array and corresponding support circuitry. The present invention provides a highly efficient testing mode to be entered that allows any type of advanced testing to be performed on the memory array without regard to the restrictions imposed by the various status flags that may be present. The testing mode can be entered by a completely user-defined mechanism. During this testing mode, the user has complete control over the contents of the memory array and can also have complete control over the positioning of the write word line with respect to the read word line without, for example, any write-read word line pointer equality signals being generated. In one example of the present invention used in a FIFO, testing times required for data retention testing are reduced from approximately six seconds to approximately 500µ seconds for each part tested, since the entire internal memory core of the FIFO can be tested in a single pass without regard to the external depth of the FIFO.

16 Claims, 3 Drawing Sheets

TESTING METHOD FOR FIFOS

FIELD OF THE INVENTION

This invention relates to memory arrays generally, and more particularly to a method for entering an advanced test mode which disables any flag restrictions in a synchronous or asynchronous FIFO buffer.

BACKGROUND OF THE INVENTION

It is well known to construct a memory array, such as a first-in first out (FIFO) buffer, having a variety of restrictive flags. Various restrictive flags include, but are not limited to, a full flag that limits the writing to the FIFO when the FIFO is full, an empty flag that limits the reading of the FIFO when the FIFO is empty, a half-full flag that indicates when the FIFO is half-full, an almost full flag that indicates when the FIFO is almost full, an almost empty flag that indicates when the FIFO is almost empty, and a write-read word line equality signal that indicates when the read and write pointers are equal. The various status flags prevent undesirable effects such as under-running the FIFO or over-running the FIFO. The various status flags provide indispensable information used during the implementation of the FIFO. However, the status flags can be an inhibiting factor when it is desirable to perform an advanced FIFO test. Various advanced FIFO tests include, but are not limited to, data retention testing, debugging array contents and monitoring the effect of the write word line being equal to the read word line without any bit-line shorters. With the various status flags present, it is impossible for the user to manipulate the read and write word lines arbitrarily (at will) throughout the FIFO array. The user is strictly held to legal operations to the FIFO array based on the actual status flags. For the user to perform advanced tests such as data retention, a complex repetition of writing to the FIFO until it is full and then reading from the FIFO until it is empty would have to be performed until all the memory cells are written to and read from. In a typical case where the FIFO depth is a fraction of the actual number of memory cells in the array, this repetition would have to be performed multiple times consuming vast amounts of test time. With the status flag restrictions in place, there is no way to read every memory cell in the memory core. Additionally, there is no way to write every memory cell in the memory core. The status flag inhibits under-running and over-running of the FIFO. An alternative would be to probe the internal silicon of the FIFO to determine the contents of the FIFO array. This is a difficult process and is not normally available at the packaged level of the FIFO.

The status flags inhibit the user from having complete control of the read and write pointers within the FIFO array. Additionally, the data retention testing time required with the status flags enabled can be very long. Therefore, it is impossible to write the memory core completely full and read the memory core completely empty, and it is correspondingly impossible to determine preferential states in the memory array after initial power-up or any particular sequence of events.

Referring to FIG. 1, a prior art FIFO buffer 10 is shown generally comprising a memory array 12, an input register block 14, an output register block 16, a write clock generator 18, a read clock generator 20 and a status flag logic block 22. The input register block 14 receives an input 23 from a data bus 24. The input register block 14 presents an output to a data bus 26 that is received by the memory array 12. The input register block 14 also receives an input 28 from an output 36 of the write clock generator 18. The input 28 represents a control signal that suspends the write pointer control 38 and the input register block 14 when a flag is received from the status flag logic block 22 indicating that the memory array 12 is full.

The write clock generator 18 receives an input 30 from an external write clock and an input 32 from the status flag logic block 22. The write clock generator 18 presents an output 36 that is received by a write pointer control 38 and the input 28 of the input register 14. An output 40 is received by the status flag logic block 22. When the status flag is received at the input 32, the write clock generator 18 sends a control signal over the output 36 that suspends the write pointer control 38, the input register 14 and ultimately the memory array 12.

The read clock generator 20 receives a first input 42 from an external read clock and a second input 43 from the status flag logic block 22. The read clock generator 20 has an output 44 that is presented to a read pointer control 46 and to the output register block 16. An output 50 is presented to the status flag logic block 22. The write pointer control 38 presents a series of inputs 52a and 52b thru 52i to the memory array 12. Similarly, the read pointer control 46 presents the number of outputs 54a and 54b thru 54i to the memory array 12. The status flag logic block 22 implements the various status flags that restrict the input received by the memory array 12 through the data bus 26. The status flags also restrict the information received by the output register 16 from the memory array 12. The status flags make it impractical to test the entire contents of the memory array 12 during post production quality control or impossible during other advanced testing routines.

SUMMARY OF THE INVENTION

The present invention provides a system for testing a memory array and corresponding support circuitry. The present invention provides a highly efficient testing mode to be entered that allows any type of advanced testing to be performed on the memory array without regard to the restrictions imposed by the various status flags that may be present. The testing mode can be entered by a completely user-defined mechanism. During this testing mode, the user has complete control over the contents of the memory array and can also have complete control over the positioning of the write word line with respect to the read word line without, for example, any write-read word line pointer equality signals being generated. In one example of the present invention used in a FIFO, testing times required for data retention testing are reduced from approximately six seconds to approximately 500μ. seconds for each part tested, since the entire internal memory core of the FIFO can be tested in a single pass without regard to the external depth of the FIFO.

Objects, features and advantages of the present invention are to provide a system for entering a testing mode of a memory array without regard to status flags. The system produces the testing mode in a completely user defined fashion, provides package level testing of the memory array without resorting to probing the internal silicon to determine the contents of the memory array and allows the user complete control over the internal contents of the memory array.

BRIEF DESCRIPTION OF THE DRAWINGS

These and other objects, features and advantages of the present invention will be apparent from the following detailed description and the appended claims in which:

3

Figure 1:
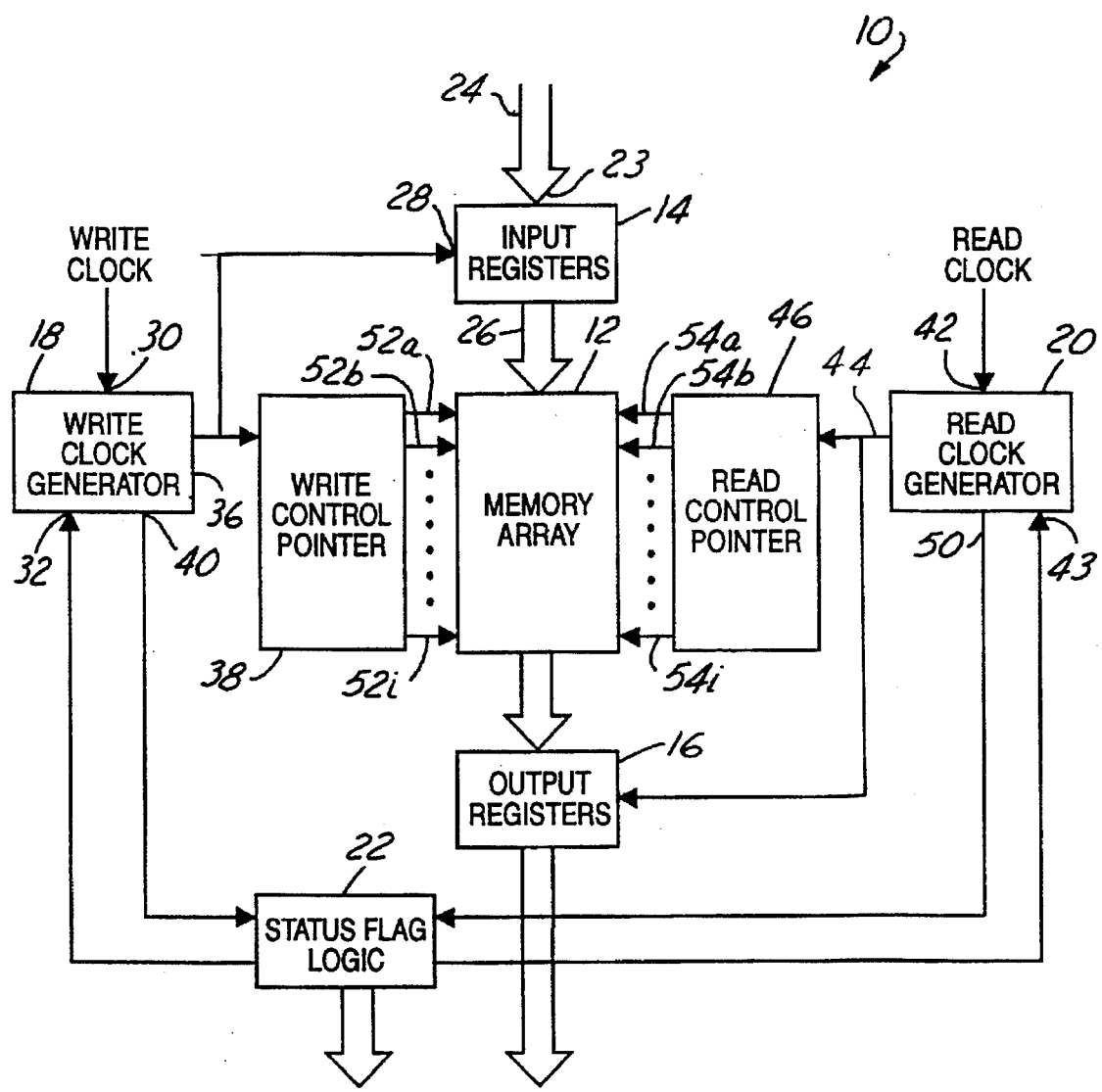
Figure 2:
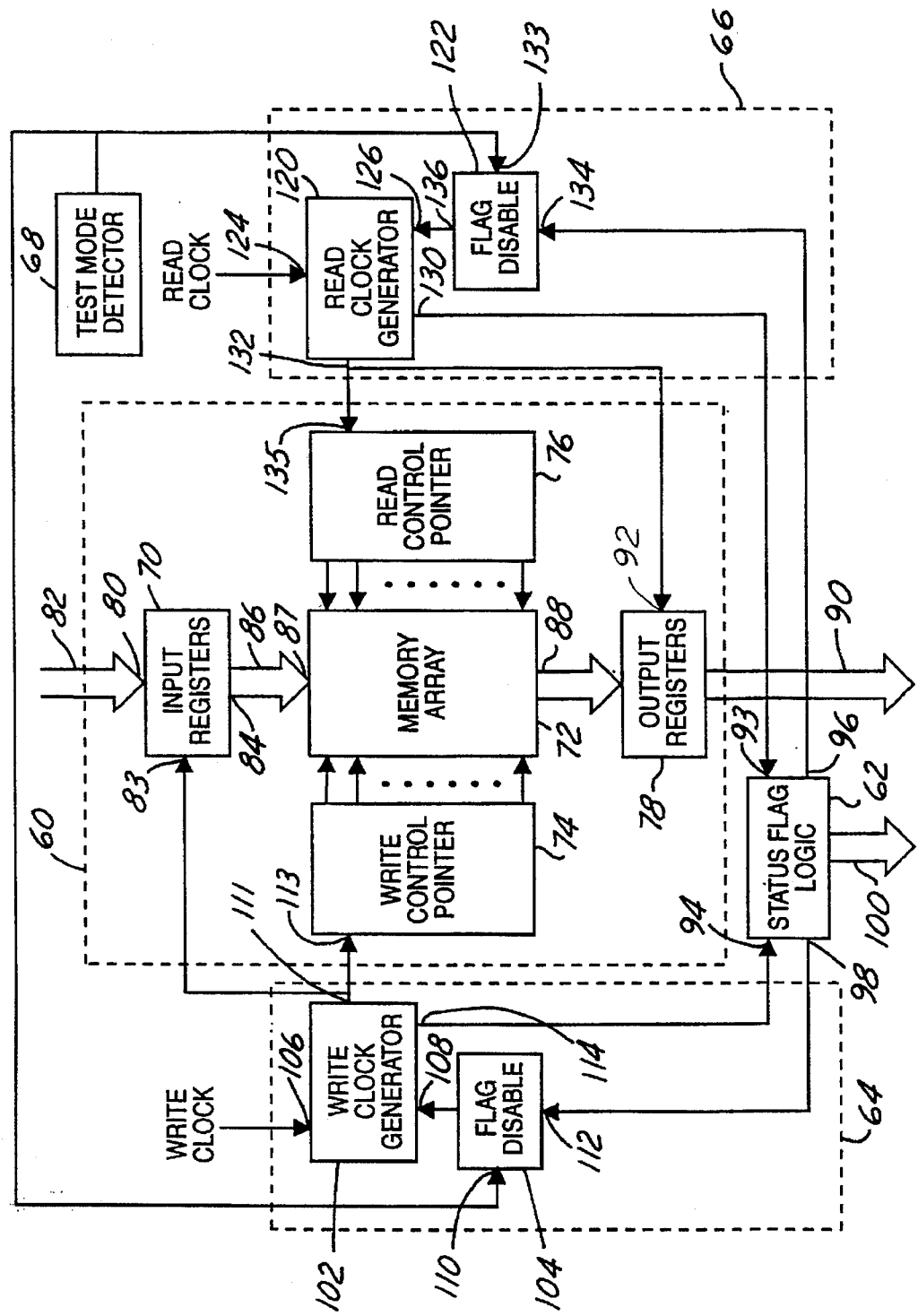
Figure 3:
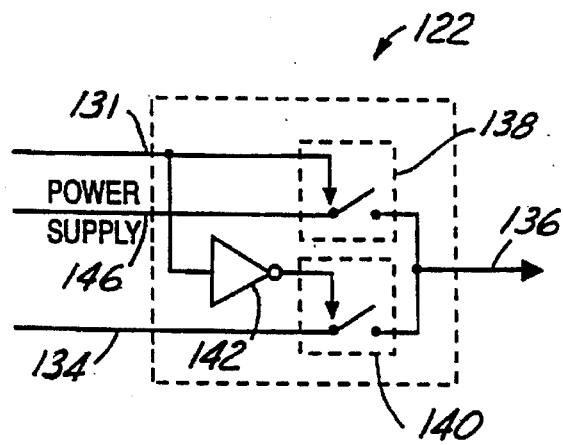
Figure 4:
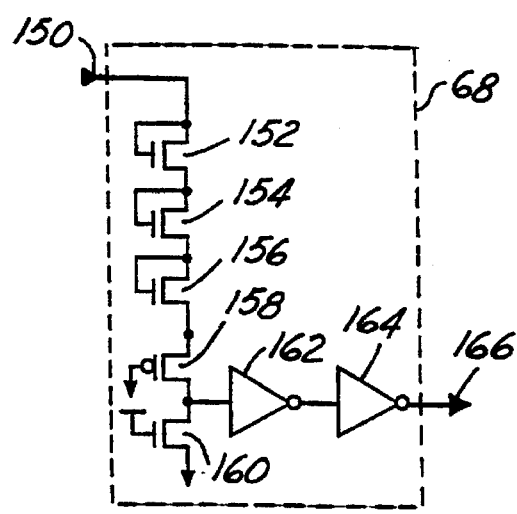
Figure 5:
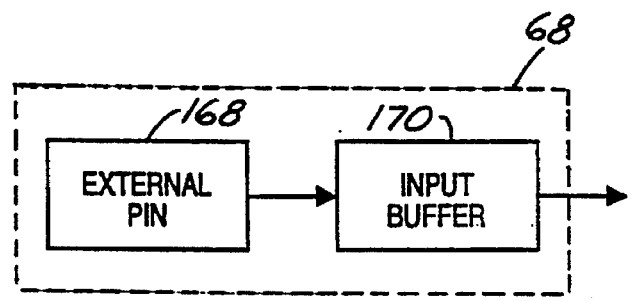

FIG. 1 is a block diagram of the prior art;

FIG. 2 is a block diagram of a FIFO implementing a test mode detector and flag disable logic;

FIG. 3 is a detailed view of the flag disable block;

FIG. 4 is a block diagram of a high voltage test mode detector;

FIG. 5 is a block diagram of an external pin test mode detector; and

Figure 6:
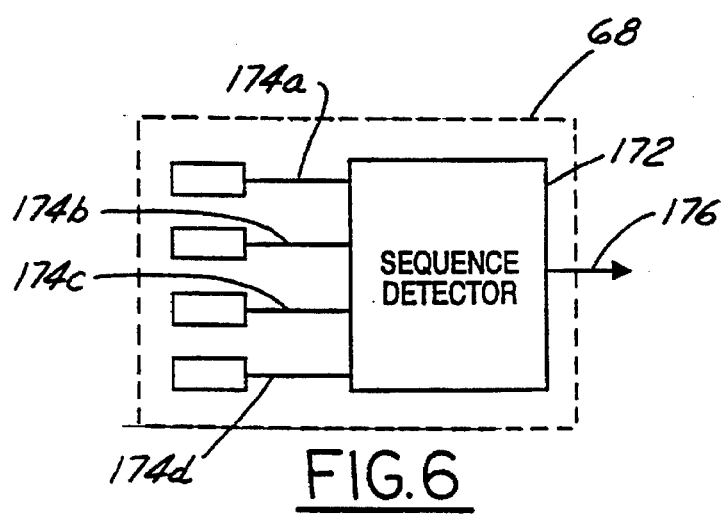

FIG. 6 is a block diagram of a test mode sequence detector.

DETAILED DESCRIPTION OF THE PREFERRED EMBODIMENT

Referring to FIG. 2, a block diagram of the present invention is shown. FIG. 2 generally comprises a memory block 60, a status flag logic block 62, a write clock block 64, a read clock block 66 and a test mode detector block 68. The memory block 60 generally comprises an input register block 70, a memory array 72, a write pointer control 74, a read pointer control 76 and an output register 78. The memory array 72 can be any type of memory device such as a first-in first-out (FIFO) buffer, a static random access memory (SRAM), a cache RAM or a dual port RAM. Other types of memory devices can be used without departing from the spirit of the present invention. A data bus 82 provides a path for loading data into the memory array 72. The input register block 70 receives an input 80 from the data bus 82 and an input 83 from the write clock block 64. The data bus 82 provides information from an external device (not shown). The input register block 70 comprises a plurality of registers and provides an output 84 to a data bus 86. The memory array 72 receives the information from the data bus 86 at an input 87. The memory array 72 presents information to a data bus 88. The data bus 88 is presented to the output register block 78 which comprises a plurality of registers. The output register block 78 has a data bus 90 that presents an output to an external device (not shown). The output register block 78 also receives an input 92 from the read clock block 66.

The status flag logic block 62 receives an input 93 from the read clock block 66 and an input 94 from the write clock block 64. The status flag logic block 62 presents an output 96 to the read clock block 66 as well as an output 98 to the write clock block 64. The status flag logic block 62 presents information to a data bus 100 that supplies status information to one or more external devices (not shown). The status flag block 62 comprises a number of internal flags that control the loading and unloading of the memory array 72 and prevent undesirable effects such as under-running the memory array 72 or over-running the memory array 72. Various other flags include, but are not limited to, a full flag that limits the writing to the memory array 72 when the memory array 72 is full, an empty flag that limits the reading of the memory array 72 when the memory array 72 is empty, a half-full flag that indicates when the memory array 72 is half-full, an almost empty flag that indicates when the memory array 72 is almost empty and an almost full flag that indicates when the memory array 72 is almost full and a write-read word line equality flag that indicates when the read and write pointers are equal. Each of these flags are typically at a first digital state when the flag is asserted and at a second digital state when the flag is not asserted. Any number of flags that are desired for a particular design application can be present in status flag logic block 62. Additional flags not specifically mentioned can also be present in status flag logic block 62. The status flag logic

4 block 62 generates the status flags according to well known flag generation techniques.

The write clock block 64 generally comprises a write clock generator 102 and a flag disable block 104. The write clock generator 102 receives an input 106 from an external write clock and a disable input 108 from the flag disable block 104. The flag disable block 104 receives an input 110 from the test mode detector block 68 as well as an input 112 from the status flag logic block 62. The write clock generator 102 presents a control signal 111 to the write pointer control block 74 and to the input register block 70. The write clock generator block 102 also has an output 114 that presents a signal to the input 94 of the status flag logic block 62. The control signal 111 is received at the input 83 of the input register block 70 and limits the amount of information presented at the input 87 of the memory array 72. The control signal 111 is also received by the write pointer control 74 as a control input 113 which limits the information received by the memory array 72 from the write pointer control 74. The control signal 111 can be in either a first mode where the write clock generator 102 follows the external write clock and is controlled by one of the internal status flags or in a test mode that suspends the recognition of the status flags. When the control signal 111 is in the test mode, the write clock generator 102 control signal 111 follows the external write clock. When the control signal 111 is in the test mode, the memory array 72 has effectively no status restrictions and advanced testing of the memory array 72 is realized. The test mode effectively locks the write clock generator 102 into a mode consistent with the mode where the status flag allows writing to the memory array 72. The disable input 108 switches the control signal 111 between the first mode and the test mode. The flag disable block 104 receives an input 110 from the test mode detector block 68 as well as an input 112 from the status flag logic block 62. The input 112 represents the internal status flags generated by the status flag logic block 62 that are used to control the information presented to the memory array 72.

The read clock block 66 generally comprises a read clock generator 120 and a flag disable block 122. The read clock generator 120 receives an input 124 from an external read clock as well as a disable input 126 from the flag disable block 122. The flag disable block 122 receives an input 133 from the test mode detector block 68 as well as an input 134 from the status flag logic block 62. The read clock generator 120 presents a control signal 132 to the read pointer control block 76 and to the output register block 78. The read clock generator block 120 also has an output 130 that presents a signal to the input 93 of the status flag logic block 62. The control signal 132 is received at the input 92 of the output register block 78 and limits the amount of information received from the data bus 88 of the memory array 72. The control signal 132 is also received by the read pointer control 76 as a control input 135 which limits the information received by the memory array 72 from the read pointer control 76. The control signal 132 has a similar function as the control signal 111 that is received as the input 113 to the write pointer control 74. The disable input 126 switches the control signal 132 between the first mode and the test mode. The flag disable block 122 receives an input 133 from the test mode detector block 68 as well as an input 134 from the status flag logic block 62. The input 134 represents the internal status flags generated by the status flag logic block 62 that are used to control the information retrieved from the memory array 72.

Referring to FIG. 3, a detailed view of the flag disable block 122 is shown. The flag disable block 122 receives an input 134 from the status flag logic block 62 as well as an input 133 from the test mode detector block 68. The flag disable block 122 presents an output 136 at the input 126 of the read clock generator 120. The flag disable block 122 comprises a first switch 138 and a second switch 140. The first switch 138 receives a signal from the input 133. The switch 138 also receives an input 146 from an external power supply or other supplied signal. The switch 140 receives, through a first inverter 142, a first input from the input 133 and a second input from the input 134. Either the switch 138 or the switch 140 presents the output 136 of the flag disable block 122. When the signal is present at the input 131, the flag disable block 122 will present an output 136 indicating the test mode is present passing signal input 146 to signal output 136. This effectively ignores any inputs received at input 134 representing the internal status flags of the device. The flag disable block 122 is illustrated as one example of a switching circuit that will disable a first input indicating the internal status flags in favor of a second input indicating the test mode. Other examples of such a switching circuits can be provided without departing from the spirit of the present invention. The flag disable block 104 of the write clock block 64 is constructed similarly to the flag disable block 122.

Referring to FIG. 4, an implementation of the test mode detector block 68 is shown comprising a high voltage detection circuit. The test mode detector block 68 generally comprises a high voltage detection pin 150, a series of transistors 152, 154, 156, 158 and 160, a first inverter 162 and a second inverter 164. Under normal operating conditions, the high voltage detect pin 150 operates at a standard voltage of, for example, five volts. When the pin 150 receives an enhanced voltage of higher than the standard voltage of five volts, such as 12 volts, the test mode detector 68 presents an output signal at a pin 166. The example shown is FIG. 4 is one example used to implement the high voltage detection technique of the present invention. The high voltage detection circuit shown in FIG. 4 can be implemented on more than one input pin of the memory array 72 to provide an additional safe guard against inadvertent disabling of the internal status flags.

Referring to FIG. 5, an external pin implementation of the present invention is shown. The test mode detector 68 has an external pin 168 that will enable the flag disable blocks 122 and 104, which will in turn ignore the internal status flags. The external pin implementation also includes an input buffer 170 to manipulate the signal present at the external pin 168 in any manner desired for the design requirements of a particular application.

Referring to FIG. 6, a sequence detection technique implementing the test mode detector 68 is shown. The test mode detector block 68 includes a sequence detector 172. The sequence detector 172 has several external pins 174a, 174b, 174c and 174d. The number of pins 174a–d can be adjusted to fit the design requirements of a particular application. When a particular sequence of voltages, such as five volts, are sensed on the control pins 174a–d, the test mode detector block 68 will enable the flag disable blocks 104 and 122, which will in turn ignore the internal status flags. This special sequence can be any predetermined order that will be recognized by the sequence detector 172. The special sequence could be pin 174a, then 174c and then 174d. If a five volt signal is sensed at pins 174a–d in the predetermined sequence, then the sequence detector 172 will recognize the sequence and present an output 176 that will disable the internal status flags. The order of the sequence of the pins 174a–d is discussed for illustrative purposes only. Any order, and any number of sensing a voltage to the pins 174a–d can be used to implement the sequence detector that disables the internal status flags. The sequence detector technique can be combined with the high voltage detector technique to provide even greater reliability when disabling the internal status flags.

It is to be understood that modifications to the invention might occur to one with skill in the field of the invention within the scope of the appended claims.

We claim:

1. A memory comprising:

a memory array having a first input for receiving information from a first external device, a control input for receiving a control signal and an output for presenting said information to a second external device, said memory array receives and presents said information when said control signal is at a first digital state, said memory array does not receive and present said information when said control signal is at a second digital state;

control means for presenting said control signal to said control input of said memory array, said control means having a disable input for indicating when said memory array is in a test mode; and disable means for presenting a disable signal at said disable input of said control means, wherein said disable means passes an external signal as an output of said disable means and locks said control signal at said first digital state when said memory array is in said test mode.

2. The memory according to claim 1 wherein said memory array receives said information from said first external device and presents said information to said second external device.

3. The memory according to claim 1 wherein said information comprises digital information that is in either said first digital state or said second digital state.

4. The memory according to claim 1 wherein said control signal comprises a full flag that is at said first digital state when said memory array is full and is at said second digital state when said memory array is not full.

5. The memory according to claim 1 wherein said control signal comprises an empty flag that is at said first digital state when said memory array is empty and is at said second digital state when said memory array is not empty.

6. The memory according to claim 1 wherein said control signal comprises a half full flag that is at said first digital state when said memory array is half full and is at said second digital state when said memory array is not half full.

7. The memory according to claim 1 wherein said control signal comprises an almost full flag that is at said first digital state when said memory array is almost full and is at said second digital state when said memory array is not almost full.

8. The memory according to claim 1 wherein said control signal comprises an almost empty flag that is at said first digital state when said memory array is almost empty and is at said second digital state when said memory array is not almost empty.

9. The memory according to claim 1 wherein said control signal comprises a write read equal flag that is at said first digital state when said memory array has a write pointer and a read pointer that are equal and is at said second digital state when said write pointer and said read pointer are not equal.

10. The memory according to claim 1 wherein said disable means further comprises an input that senses either a standard voltage or an enhanced voltage, said disable means presents said disable signal to said control means when said enhanced voltage is sensed.

11. The memory according to claim 1 wherein said disable means further comprises a plurality of sense inputs each tuned to sense a voltage, said disable means presents said disable signal to said control means when said voltage is sensed on a particular number of said plurality of sense inputs.

12. The memory according to claim 11 wherein said disable means presents said disable signal to said control means when said particular number of said plurality of sense inputs are sensed in a particular order.

13. The memory according to claim 1 wherein said disable means comprises a pin that is in either an asserted state or a not asserted state, said disable means presents said disable signal to said control means when said pin is in said asserted state.

14. The memory according to claim 1 wherein said disable means detects a particular sequence of voltages from a plurality of control pin inputs.

15. A memory comprising:

a memory array having a first input for receiving information from a first external device, a set of pointer inputs for receiving pointer signals and an output for presenting said information to a second external device, said memory array receives and presents said information when said pointer signals are present, said memory array does not receive and present said information when said pointer signals are not present;

pointer means for presenting said pointer signals to said set of pointer inputs, said pointer means having a control input;

a flag generator for presenting a control signal to said control input of said pointer mean, said flag generator having a disable input for indicating when said memory array is in a test mode; and disable means for presenting a disable signal at said disable input of said flag generator wherein said disable means passes an external signal as an output of said disable means and locks said control signal when said pointer signals are present and when said memory array is in said test mode.

16. The memory according to claim 15 wherein said memory array receives said information from said first external device and presents said information to said second external device.

* * * * *